May 23, 1961 G. W. APPLEGATE 2,985,846

SYNCHRONIZED BLOCKING OSCILLATOR

Filed Jan. 6, 1959

INVENTOR,
GEORGE WYCOFF APPLEGATE
BY Harry M. Saragovitz
ATTORNEY.

2,985,846

Patented May 23, 1961

2,985,846

SYNCHRONIZED BLOCKING OSCILLATOR

George W. Applegate, West Belmar, N.J., assignor to the United States of America as represented by the Secretary of the Army Filed Jan. 6, 1959, Ser. No. 785,296

2 Claims. (Cl. 331—112)

(Granted under Title 35, U.S. Code (1952), sec. 266)

The invention described herein may be manufactured and used by or for the Government for governmental purposes, without the payment of any royalty thereon.

This invention relates to oscillators and more particularly to blocking oscillators. More particularly this invention relates to transistorized blocking oscillators.

One of the main virtues of transistorized oscillators and blocking oscillators is the very low power requirement and the adaptability to comparatively low voltage operation. While a vacuum tube requires a substantial voltage for proper functioning, a transistor will function on a fraction of a volt. This low voltage operation is very desirable and opens new fields of uses for blocking and other oscillators where only low voltage is obtainable or practical.

However, the output voltage, particularly of a blocking oscillator, is limited by the supply or bias voltage. In most cases, the voltage swing of the oscillations cannot be any greater than the supply voltage itself. This does not preclude operation of a transistorized blocking oscillator at extremely low voltages, but it does provide such a small output voltage swing that the triggering action at the end of a resistance capacitance discharge interval is comparatively indefinite, and there is so little voltage change that the use of a triggering pulse to make the cycle more constant or to synchronize with an external source of oscillation is virtually impossible.

It is therefore an object of this invention to provide an improved transistorized blocking oscillator.

It is a further object of this invention to provide a transistorized blocking oscillator having a more positive triggering action and a more accurate repetition frequency.

It is a further object of this invention to provide an improved low voltage transistorized blocking oscillator adapted to be synchronized with higher frequency synchronizing pulses.

This and other objects of this invention are accomplished by adding a condenser to an inductive load in the collector circuit of a transistorized blocking oscillator to form an oscillatory tank circuit of a frequency very much higher than that of the blocking oscillator. The conventional, resistance capacitance, time constant network in the emitter circuit of the transistor establishes the interval during which the transistor is cut-off, which maintains the frequency of the blocking oscillator, while the inductive capacitive network in the collector circuit of the transistor causes that circuit to oscillate at the very much higher frequency during the interval that the transistor is conducting.

This circuit and its operation will be more fully understood and other and further objects of this invention will become more apparent from the following specification and the drawings of which;

Figure 1:
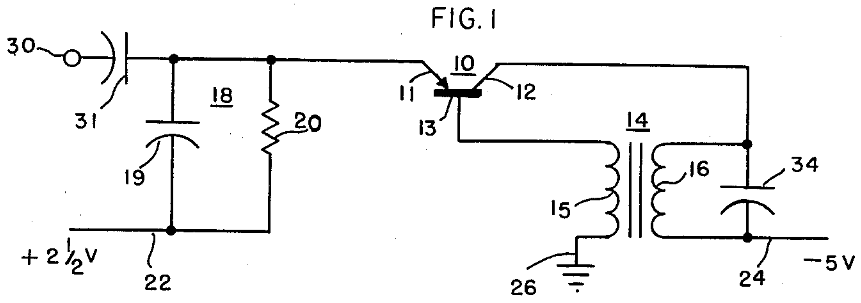
Figure 1 shows a typical circuit according to the teachings of this invention.

Referring now more particularly to Figure 1, the transistor 10 has an emitter 11, a collector 12, and a base electrode 13. A transformer 14 has a secondary winding 15 in the base circuit of the transistor and a primary winding 16 in the collector circuit of the transistor. A resistance capacitance discharge network 18 in the emitter circuit of the transistor consists of the condenser 19 and the resistor 20.

The emitter voltage is applied at 22 and the collector voltage is applied at 24. The ground point of the circuit is at 26. An input 30 through a coupling capacitor 31 is connected to the emitter. A condenser 34 is connected across the secondary 16 of the transformer.

In the operation as a basic blocking oscillator, when the transistor starts to conduct the increase in current through the collector circuit and the transformer winding 16 induces a voltage in the winding 15 which drives the base electrode suddenly in the direction which further increases the collector current. When the collector current can no longer increase, the induced voltage starts to drop, and does so as precipitously as it was built up. During this interval, the emitter draws current and becomes biased beyond cut-off and no more collector current can flow until the charge on the condenser in the emitter circuit is carried off through the resistor 20. This discharge time establishes the normal period of the oscillation. When the emitter reaches the proper level, collector current again flows and the cycle is repeated.

The addition of the condenser 34 across one of the coils 16 of the transformer 14 provides a tuned circuit, which causes oscillation when the collector current flows since the natural frequency of the tank circuit 16—34 is fed back to the base electrode input of the amplifying transistor through the transformer, 14. The value of the condenser is chosen low enough, in combination with the secondary 16 of the transformer, to provide a very much higher period of oscillation than that of the basic blocking oscillator. The frequency of this oscillator is so high that oscillations are sustained for a substantial number of cycles during the very short interval that collector current is flowing.

Since the free swing of an oscillator reaches voltage peaks greater than the basic supply voltage, this oscillation provides a peak charging voltage substantially higher than that of the collector supply. This in turn charges the condenser 19 in the emitter circuit to a value of voltage substantially higher than the voltage reached during the same interval with only the voltage from the collector supply available since the higher voltage swing of the collector during oscillation requires a relatively higher emitter bias level for cut-off.

Figure 2:
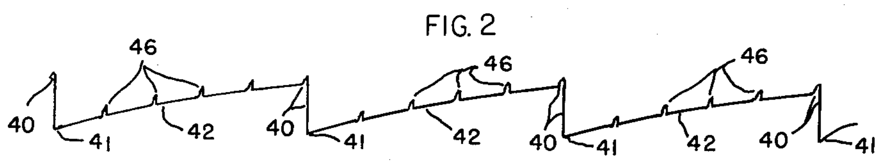
Figure 2 shows wave forms of the voltage at the emitter of a conventional blocking oscillator.
Figure 3:
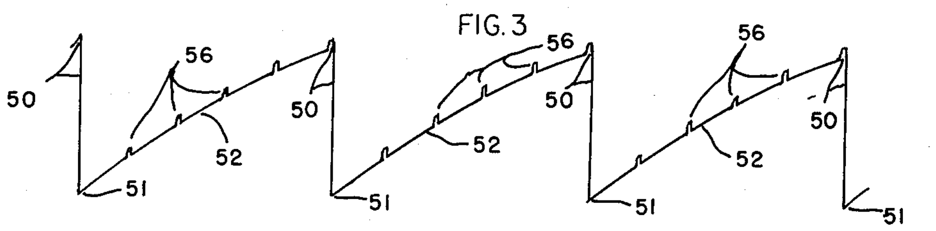
Figures 3 and 4 show wave forms of the voltage at the emitter and the collector of the transistor in this circuit.

The difference between the operation of a standard circuit and the circuit of applicant's Figure 1 is seen in the difference between Figures 2 and 3 of the drawings. Figures 2 and 3 show the relative wave forms of the voltage at the emitter of the transistors in corresponding oscillator circuits; Figure 2 without the condenser 34 and Figure 3 with the condenser 34 added. The addition of the condenser 34 produces a very much greater voltage swing for the emitter without any additional voltage supply requirement or any other changes in the circuit.

Figure 4:
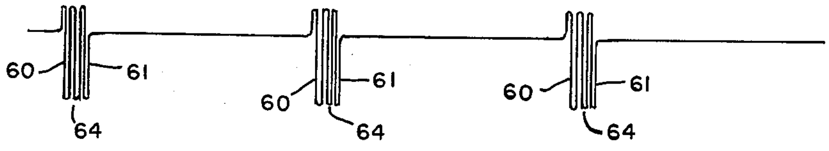

Figure 4 shows the wave form of the voltage at the collector of the transistor of Figure 1, and corresponding to Figure 3, during the same time interval. It should be noted, however, that only a few cycles of the high frequency oscillation could be shown, even with an exaggerated interval of time, because of the mechanical limitations of space. Neither the full number of oscillations nor the precise wave shape could be shown in so limited a space. In practice there is a certain build-up time for the oscillations and an even larger decay time.

The leading edges, 40, 50, and 60 show the point at which the transistors begin to conduct. The points 41, 51, and 61 are the points at which the transistors are cut off again. During this interval the oscillations 64 are built up in the collector circuit of the transistor due to the presence of the tuned circuit 16 and 34 of Figure 1.

These oscillations cause the considerably higher charge to build up on the condenser 19 at the emitter of the transistor as shown in Figure 3. The condenser 19 discharges through the resistor 20 somewhat as shown by the wave form 52 until the voltage reaches the level at which the collector starts to conduct again (50). Then the cycle is repeated.

The sharper angle or slope 52 produced by the circuit shown in Figure 1 with the same voltage conditions under which the conventional circuit can only provide the slope 42 gives the more positive firing point 50 and correspondingly improved oscillator stability. This steeper slope, and greater voltage swing, also permits the use of high frequency synchronizing pulses, such as 56, from an external source to stabilize the frequency of the blocking oscillator at a submultiple of the frequency of the synchronizing pulses.

If the same synchronizing pulses were applied to the wave form of Figure 2 as shown by the pulses 46, the circuit would not be stable because there is insufficient amplitude difference between the peaks of the last few pulses approaching the time for the next firing 40 of the blocking oscillator.

The synchronizing pulses are directly applied to the circuit at point 30, through the decoupling condenser 31, in a manner well known in the art.

The operation of the circuit shown and described above was obtained by using an NPN Transistor and a 1 to 1 ratio transformer. The condensers, 19, 31, and 34 were .047 microfarad, 220 micro-microfarads and 220 micro-microfarads respectively. The resistor 20 was 45000 ohms. Such a circuit results in high frequency oscillations of 1 megacycle and blocking oscillations of 4,500 cycles per second.

What is claimed is:

1. In a highly stable, low voltage, blocking oscillator an NPN transistor having emitter, collector and base electrodes, a source of positive voltage, a resistive-capacitive network having a time constant that establishes the frequency of the blocking oscillator connecting the emitter electrode to said source of positive voltage, a source of negative voltage, an inductive network comprising a transformer having primary and secondary windings, a ground terminal, said secondary winding of said transformer connecting the base electrode of said transistor to said ground terminal, said primary winding of said transformer connecting the collector electrode of said transistor to said source of negative voltage, said transformer connected for positive feedback of the collector output to the base electrode, a condenser connected across the said primary winding and forming an inductive-capacitive network having a resonant frequency very much higher than that of said blocking oscillator, said transistor being normally in a nonconducting state and said collector circuit oscillating at said very much higher frequency during the conducting state of said transistor, a source of synchronizing pulses, and a coupling condenser connecting said source of synchronizing pulses to said emitter circuit.

2. In a highly stable, low voltage, blocking oscillator, a transistor having emitter, collector and base electrodes, a source of voltage, a resistive-capacitive network having a time constant that establishes the frequency of the blocking oscillator connecting the emitter electrode to said source of voltage, a source of opposite voltage, an inductive network comprising a transformer having primary and secondary windings, a ground terminal, said secondary winding of said transformer connecting the base electrode of said transistor to said ground terminal, said primary winding of said transformer connecting the collector electrode of said transistor to said source of opposite voltage, said transformer connected for positive feedback of the collector output to the base electrode, a condenser connected across the said primary winding and forming an inductive capacitive network having a resonant frequency very much higher than that of said blocking oscillator, said transistor being normally in a nonconducting state and said collector circuit oscillating at said very much higher frequency during the conducting state of said transistor, a source of synchronizing pulses, and a coupling condenser connecting said source of synchronizing pulses to said emitter circuit.

References Cited in the file of this patent

UNITED STATES PATENTS

| | | |
|---|---|---|
| 1,621,034 | Slepian | Mar. 15, 1927 |
| 2,816,230 | Lindsay | Dec. 10, 1957 |
| 2,843,743 | Hamilton | July 15, 1958 |
| 2,857,518 | Reed | Oct. 21, 1958 |

FOREIGN PATENTS

| | | |
|---|---|---|
| 789,636 | Great Britain | Jan. 22, 1958 |